US012439521B2

United States Patent
Kanas et al.

(10) Patent No.: US 12,439,521 B2
(45) Date of Patent: Oct. 7, 2025

(54) COMPUTING MODULE LOCKING DEVICES

(71) Applicant: Hewlett-Packard Development Company, L.P., Spring, TX (US)

(72) Inventors: Derek Kyle Joseph Kanas, Spring, TX (US); Tony Moon, Spring, TX (US); Michael John Bugos, Spring, TX (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 692 days.

(21) Appl. No.: 17/898,630

(22) Filed: Aug. 30, 2022

(65) Prior Publication Data

US 2024/0074060 A1 Feb. 29, 2024

(51) Int. Cl.
*H05K 1/18* (2006.01)
*H01R 12/73* (2011.01)
*H01R 13/639* (2006.01)
*H05K 7/10* (2006.01)

(52) U.S. Cl.
CPC ............... *H05K 1/18* (2013.01); *H01R 12/73* (2013.01); *H01R 13/639* (2013.01); *H05K 7/10* (2013.01); *H05K 2201/09063* (2013.01); *H05K 2201/10189* (2013.01); *H05K 2201/10295* (2013.01)

(58) Field of Classification Search
CPC ........... H05K 1/15; H05K 1/142; H01R 12/73
USPC ...................................................... 174/138 D
See application file for complete search history.

(56) References Cited

U.S. PATENT DOCUMENTS

| 3,651,545 A * | 3/1972 | Hara | H05K 7/142 24/453 |
| 3,704,486 A * | 12/1972 | Blacklock | F16B 5/0642 411/908 |
| 4,158,450 A * | 6/1979 | Suzuki | G11B 25/06 |
| 4,495,380 A * | 1/1985 | Ryan | H05K 7/142 24/453 |
| 5,281,149 A * | 1/1994 | Petri | H05K 7/142 439/74 |
| 5,383,793 A | 1/1995 | Hsu et al. | |
| 5,452,184 A * | 9/1995 | Scholder | H05K 7/12 24/297 |
| 5,754,412 A * | 5/1998 | Clavin | H05K 7/142 24/453 |
| 5,833,480 A * | 11/1998 | Austin | H05K 7/142 24/453 |
| 6,726,505 B2 * | 4/2004 | Cermak, III | G06F 1/184 174/138 D |
| 6,752,276 B2 * | 6/2004 | Rumney | H05K 7/142 361/801 |

(Continued)

FOREIGN PATENT DOCUMENTS

EP 0776152 A1 5/1997

*Primary Examiner* — Neil Abrams
(74) *Attorney, Agent, or Firm* — Quarles & Brady LLP

(57) ABSTRACT

In some examples, a device comprises a circuit board including a sliding channel and a locking aperture and a locking device comprising a shelf, a stay disposed on a first surface of the shelf, an extension member connected to a second surface of the shelf, the second surface being opposite the first surface, and a wing extending from the extension member, the wing including a locking tab, where the extension member is to interface with the sliding channel of the circuit board and the locking tab is to interface with the locking aperture of the circuit board such that the stay is to secure a computing module to the circuit board.

20 Claims, 7 Drawing Sheets

(56) References Cited

U.S. PATENT DOCUMENTS

| | | | | |
|---|---|---|---|---|
| 7,040,905 B1 * | 5/2006 | Wang | ............... | H05K 7/1418 |
| | | | | 361/759 |
| 7,241,159 B1 * | 7/2007 | Chen | ............... | H01R 13/26 |
| | | | | 439/92 |
| 7,300,299 B2 * | 11/2007 | Wang | ............... | H05K 7/142 |
| | | | | 439/326 |
| 7,494,360 B2 * | 2/2009 | Zhan | ............... | H04B 1/3816 |
| | | | | 439/326 |
| 7,563,119 B2 * | 7/2009 | Hsu | ............... | H05K 7/12 |
| | | | | 439/567 |
| 7,564,697 B2 | 7/2009 | Chen | | |
| 7,682,179 B1 * | 3/2010 | Tsai | ............... | H01R 12/7005 |
| | | | | 439/328 |
| 9,310,853 B2 | 4/2016 | Yu | | |
| 10,033,123 B2 | 7/2018 | Liu | | |
| 2006/0091769 A1 | 5/2006 | Dubon | | |
| 2019/0372257 A1 | 12/2019 | Chen | | |
| 2021/0195781 A1 * | 6/2021 | Hung | ............... | H05K 7/142 |
| 2024/0074060 A1 * | 2/2024 | Kanas | ............... | H05K 7/142 |

\* cited by examiner

COMPUTING MODULE LOCKING DEVICES

BACKGROUND

Computing devices utilize multiple electronic components to operate various aspects of the computing device. In some examples, electronic components may be removed, replaced, and/or added to the computing device in order to replace failing components, enhance, and/or upgrade the computing device. In some examples, hardware is utilized to physically and/or electrically couple the electronic components to the computing device.

DETAILED DESCRIPTION

Figure 1:
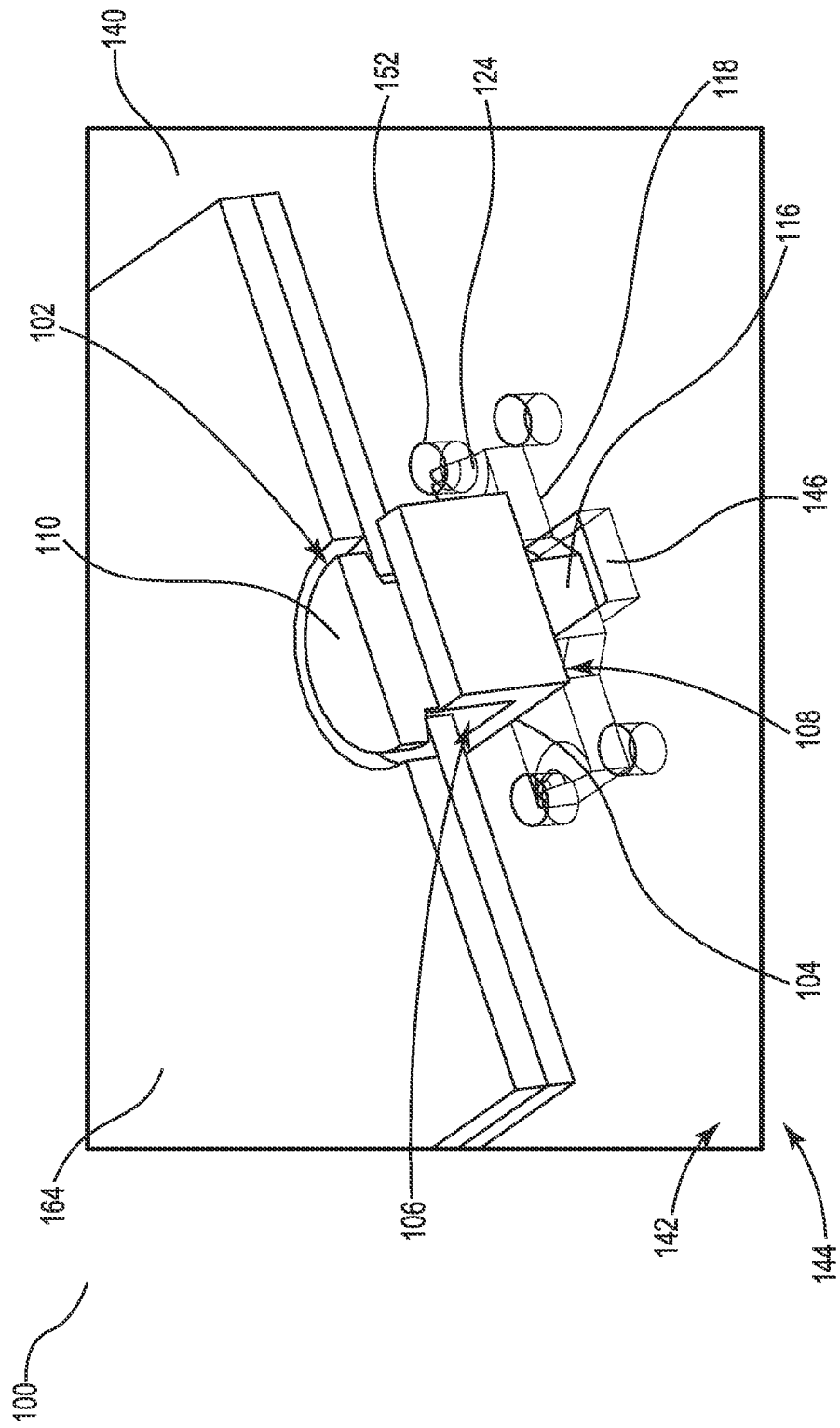
FIG. 1 illustrates an example device including a circuit board and a locking device for securing a computing module to the circuit board.

A user may utilize a computing device for various purposes, such as for business and/or recreational use. As used herein, the term computing device refers to an electronic device having a processor and a memory resource. Examples of computing devices include, for instance, a laptop computer, a notebook computer, a desktop computer, an all-in-one (AIO computer), and/or a mobile device (e.g., a smart phone, tablet, personal digital assistant, smart glasses, a wrist-worn device, etc.), among other types of computing devices.

Computing devices include a variety of electronic components utilized to operate various aspects of the computing device. In some examples, computing devices include a main operating circuit board electrically and physically connecting the variety of electronic components of the computing device, enabling signals to be transmitted and received between the electronic components. Examples of electronic components may include a computing module. As used herein, the term "computing module" refers to an independent component used as part of a computing system. Examples of a computing module include, for instance, a memory module, a graphics card, a sound card, an interface card (e.g., a network interface card (NIC)), a tuner card, and/or a modem card, among other types of computing modules.

In some examples, computing modules may be installed (e.g., by the manufacturer, distributor, end user, etc.) in the computing device. These computing modules may be removable to allow for easy replacement of failed components and/or for flexibility for changes such as advancements and/or upgrades in computing device capabilities. In previous approaches, these removable computing modules may utilize hardware to secure and connect the removable computing module to a circuit board of the computing device. As used herein, the term "circuit board" refers to an insulated board that includes conductive pathways and electronic components mounted on or etched into the board. The hardware may utilize fasteners such as screws to secure the hardware and/or computing module to the circuit board. Fasteners may utilize corresponding tooling such as a screwdriver, specialized wrenches, etc., to attach and remove the hardware. Varying portions of the removable computing module or varying removable computing modules may utilize different sizes or types of fasteners and therefore different corresponding tooling.

In these examples, fasteners and/or tooling may be lost during shipping, installation, removal, etc., or may not be provided and may not easily be replaced. Additionally, fasteners and/or tooling may be inadvertently interchanged during shipping, installation, removal, etc. As such, utilizing the incorrect hardware or tooling may cause damage and/or failure to the hardware, the computing module, and/or the operating circuit board of the computing device.

Additionally, in some examples, varying torque values may be utilized dependent upon the fastener or computing module type. Adjusting the torque value of a tool may include additional equipment and knowledge of calibration techniques. The correct tool or the correct torque value calibrated tool may not be readily available for installation or removal of the fastener and the hardware. In some examples, the correct torque value for the fastener and/or computing module may not be known, causing the incorrect tooling to be utilized for installation or removal of the fastener and hardware. Over torquing a fastener may result in damage to the hardware, computing module, and/or the operating circuit board. Insufficient torque may result in loose hardware and/or intermittent connections causing intermittent or latent fails.

The present disclosure relates to a toolless, removable hardware utilized to secure a computing module to a computing device and to create a physical connection to the computing device. The hardware may include a low-profile locking device utilizing a shelf to support the computing module and a stay to align and limit a movement of the computing device to physically couple the computing module to a circuit board of the computing device. The locking device may be installed, removed, and/or utilized to secure and support the computing module without the use of additional fasteners or tooling. Additionally, the locking device may be left installed in the computing device while not in use and therefore, readily available for future use. By utilizing the hardware, the computing module may be installed in and/or removed from the computing device without the use of tooling and with minimal time and effort, increasing efficiency and reducing stresses on the computing module and computing device involved in installation and removal of the computing module, as compared with previous approaches.

FIG. 1 illustrates an example device 100 including a circuit board 140 and a locking device 102 for securing a computing module 164 to the circuit board 140, As illustrated in FIG. 1, the circuit board 140 may include a sliding channel 146, a locking aperture 152, and the locking device 102.

The locking device 102 of the circuit board 140 may include a shelf 104, a stay 110, and an extension member 116. As illustrated in FIG. 1, the stay 110 may be disposed on a first surface 106 of the shelf 104 and the extension member 116 may be connected to a second surface 108 of the shelf 104. The second surface 108 may be opposite the first surface 106. As used herein, the term "shelf" refers to a flat piece of material utilized to hold or support an object. As used herein, the term "stay" refers to a component utilized to physically stop or minimize a potential motion of an object. As used herein, the term "extension" refers to a portion of a component constituting an addition to that component. For example, the extension member 116 may be an addition extending from the second surface 108 of the shelf 104.

In some examples, the locking device 102 may include a wing 118. As used herein, the term "wing" refers to an outlying region projecting from and subordinate to a main or central part. The wing 118 may extend from the extension member 116 and may include a locking tab 124. As used herein, the term, "tab" refers to a protrusion. As illustrated in FIG. 1, the extension member 116 may interface with the sliding channel 146 of the circuit board 140. As used herein, the term "channel" refers to an opening through a portion of material. For example, the sliding channel 146 may be an opening through a portion of the circuit board 140. The extension member 116 may be located in the sliding channel 146 of the circuit board 140 and can translate within (e.g., slide within) the sliding channel 146.

The circuit board 140 can include a locking aperture 152. As used herein, the term "aperture" refers to an opening. For example, the locking aperture 152 in the circuit board 140 may be an opening in the circuit board 140 utilized to lock the locking device 102 into a particular location. For example, the locking tab 124 of the locking device 102 may protrude from the wing 118 and interface with the locking aperture 152 of the circuit board 140 to lock the locking device 102 into a particular location on the circuit board 140. In some examples, the locking tab 124 may be a complimentary shape to the locking aperture 152 (e.g., round, triangular, square, etc.). In some examples, at least a portion of the locking tab 124 may comprise a smaller diameter than the locking aperture 152 such that the locking tab 124 fits inside the locking aperture 152 (e.g., clearance fit, though examples are not so limited).

In this way, the locking tab 124 may interface with the locking aperture 152 of the circuit board 140 such that the stay 110 is to secure the computing module 164 to the circuit board 140. For example, the second surface 108 of the shelf 104 may interface with a first side 142 of the circuit board 140. The wing 118 and the locking tab 124 of the locking device 102 may interface with a second side 144 of the circuit board 140 and the locking aperture 152. The second side 144 of the circuit board 140 may be opposite the first side 142 of the circuit board 140. In this way, the shelf 104, the wing 118, and the locking tab 124 may interface with the circuit board 140 such as to secure the locking device 102 to the circuit board 140. In this example, while the locking tab 124 is interfaced with the locking aperture 152, the computing module 164 may be located between the shelf 104 and the stay 110 such that the computing module 164 may be physically secured to the circuit board 140.

Although described herein as a single locking aperture 152, examples of the disclosure are not limited. For instance, the circuit board 140 can include a pair of locking apertures. That is, the locking aperture 152 can include a complimentary locking aperture located in the circuit board 140 on an opposite side of the sliding channel 146 from the locking aperture 152.

Figure 2B:
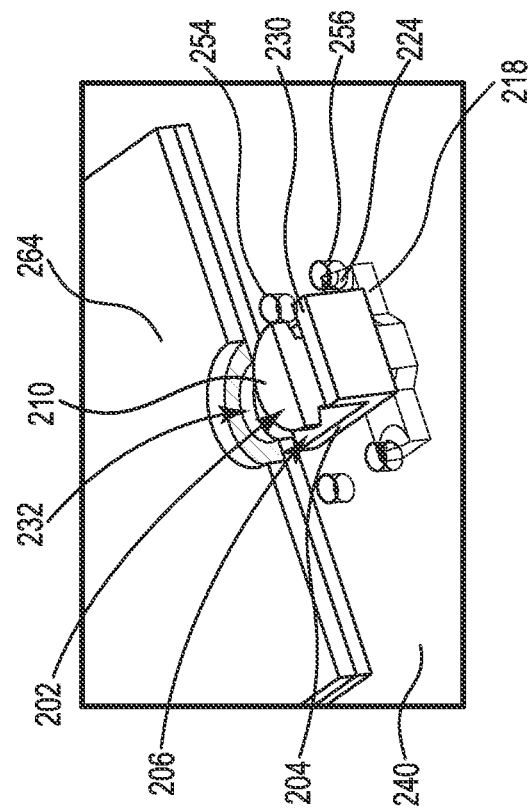
FIG. 2B illustrates an example locking device in an open position and disengaged from a computing module.
Figure 2A:
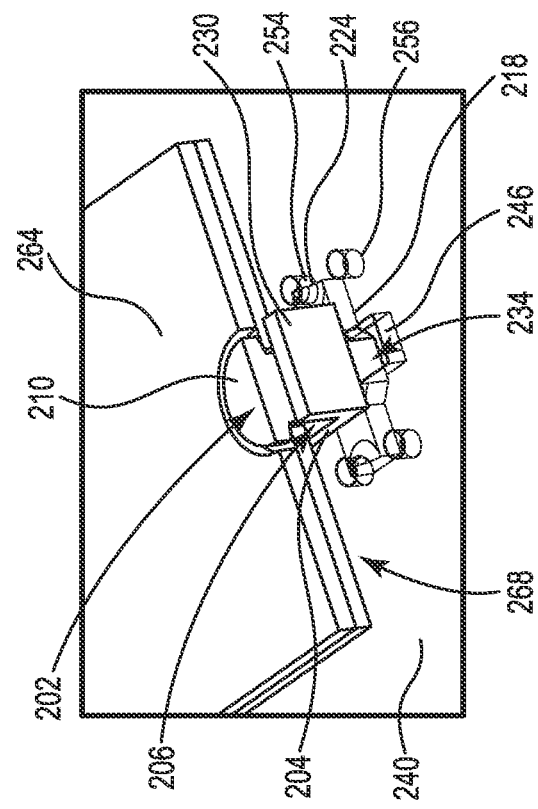
FIG. 2A illustrates an example locking device in a closed position and engaged with a computing module.

FIG. 2A illustrates an example locking device 202 in a closed position 234 and engaged with a computing module 264. In some examples, the locking device 202 includes the same or similar elements as the locking device 102 as referenced in FIG. 1. For example, the locking device 202 may include a shelf 204, a wing 218, and a locking tab 224 interfaced with a circuit board 240, the circuit board 240 including the same or similar elements as the circuit board 140 as referenced in FIG. 1.

For example, the circuit board 240 may include a sliding channel 246 and a locking aperture. In some examples, the locking aperture may be a first locking aperture 254 and the circuit board 240 may include a second locking aperture 256, The locking device 202 may interface with the sliding channel 246, the first locking aperture 254, and the second locking aperture 256 of the circuit board 240. For example, while the locking tab 224 of the wing 218 is interfaced with the first locking aperture 254, the locking device 202 may be in the closed position 234 such that the locking device 202 secures the computing module 264 to the circuit board 240. In this way, the locking tab 224 may lock the locking device 202 in the closed position 234.

As illustrated in FIG. 2A, while the locking device 202 is in the closed position 234, a first surface 206 of the shelf 204 may interface with a second side 268 of the computing module 264 to support the computing module 264. The locking device 202 may interface with the computing module 264 such that the computing module 264 is located between the shelf 204 and a stay 210 of the locking device 202, The locking device 202 may be positioned in the closed position 234 such that the stay 210 limits a movement of the computing module 264. In other words, while the locking device 202 is in the closed position 234, the locking device 202 may support and secure the computing module 264 to the circuit board 240. Further, while the locking device 202 is in the closed position 234, the location of the locking device 202 may indicate (e.g., to a user) that the computing module 264 is electrically and physically seated with an electrical connector (e.g., as further illustrated in FIG. 4).

FIG. 2B illustrates an example locking device 202 in an open position 232 and disengaged from a computing module 264. In some examples, the locking device 202 includes the same or similar elements as the locking device 102 as referenced in FIG. 1 and the locking device 202 as referenced in FIG. 2A. For example, the locking device 202 may include a shelf 204, a wing 218, and a locking tab 224 interfaced with a circuit board 240, the circuit board 240 including the same or similar elements as the circuit board 140 as referenced in FIG. 1 and the circuit board 240 as referenced in FIG. 2A. For example, the circuit board 240 may include a sliding channel 246 and a locking aperture.

In some examples, the locking aperture may be a first locking aperture 254 and the circuit board 240 may include a second locking aperture 256. The locking device 202 may interface with a sliding channel 246, the first locking aperture 254, and the second locking aperture 256 of the circuit board 240. For example, while the locking tab 224 of the wing 218 is coupled to the second locking aperture 256, the locking device 202 may be in the open position 232 such that the computing module 264 is removable from the circuit board 240. In this way, the locking tab 224 may lock the locking device 202 in the open position 232.

In some examples, the circuit board 240 may include one locking aperture (e.g., the first locking aperture 254). The locking device 202 may interface with the sliding channel 246 such that while the locking device 202 is disposed on the sliding channel 246 of the circuit board 240 in the open position 232 the locking tab 224 interfaces with the circuit board 240. In this way, the locking device 202 may be in the open position 232 and may not be locked in the open position 232. In this example, transitioning from an unlocked open position 232 to a closed position (234 as illustrated in FIG. 2A) may use less force and may be easier than transitioning from a locked open position 232 to the closed position (234 as illustrated in FIG. 2A).

Accordingly, the locking device 202 may be transitioned between the open position 232, as illustrated in FIG. 2B, and the closed position (234 as illustrated in FIG. 2A) and/or vice versa. For example, the locking device 202 may transition from the open position 232 to the closed position (234 as illustrated in FIG. 2A) within the sliding channel 246. In some examples, the locking device 202 may include a stay 210 disposed on a first surface 206 of the shelf 204 of the locking device 202. In this example, the transition from the open position 232 to the closed position (234 as illustrated in FIG. 2A) may be in response to a force applied to the stay 210. In a similar way, the locking device 202 may transition from the closed position (234 as illustrated in FIG. 2A) to the open position 232 in response to a force applied to the stay 210. The force applied to transition the locking device 202 from the open position 232 to the closed position (234 as illustrated in FIG. 2A) may be applied in a first direction and the force applied to transition the locking device 202 from the closed position (234 as illustrated in FIG. 2A) to the open position 232 may be applied in a second direction (not depicted in the illustrations).

In some examples, the locking device 202 may further include a lever 230. The lever 230 may be disposed on the first surface 206 of the shelf 204 and adjacent to the stay 210. In this example, the locking device 202 may be transitioned between the open position 232, as illustrated in FIG. 2B, and the closed position (234 as illustrated in FIG. 2A). For example, the locking device 202 may transition from the open position 232 to the closed position (234 as illustrated in FIG. 2A) within the sliding channel 246 in response to a force applied to the lever 230 in the first direction (e.g., by a user). The locking device 202 may transition from the closed position (234 as illustrated in FIG. 2A) to the open position 232 in response to a force applied to the lever 230 in the second direction.

As illustrated in FIG. 2B, in response to applying a force to the locking device 202, the locking device 202 may transition from the closed position (234 as illustrated in FIG. 2A) to the open position 232. As such, while the locking device 202 is in the open position 232, the computing module 264 is removable from the circuit board 240. In this way, the computing module 264 may be removable to allow for replacement due to failure or to allow for upgrades or changes in computing capabilities.

Figure 3B:
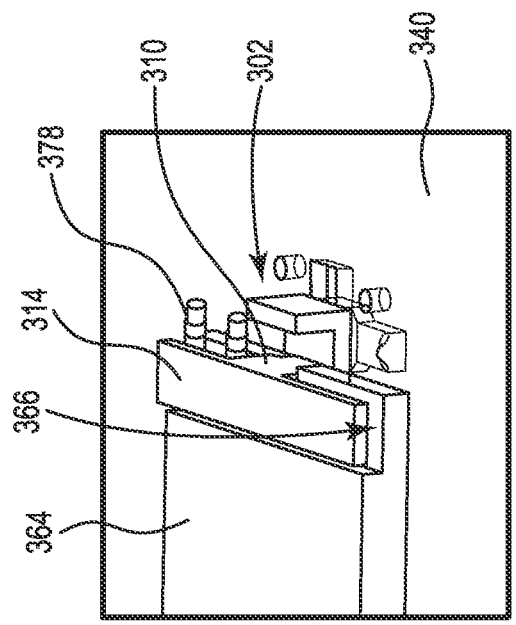
FIG. 3B illustrates an example locking device, to interface with a computing module and a circuit board, in a closed position.
Figure 3A:
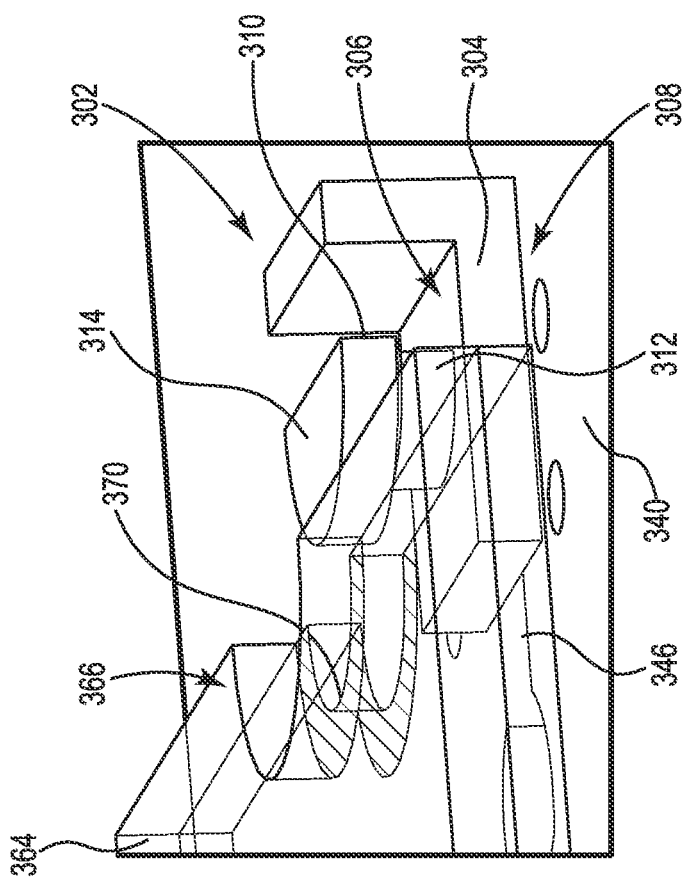
FIG. 3A illustrates an example locking device, to interface with a computing module and a circuit board, in an open position.

FIG. 3A illustrates an example locking device 302, to interface with a computing module 364 and a circuit board 340, in an open position. In some examples, the locking device 302 includes the same or similar elements as the locking device 102 as referenced in FIG. 1 and the locking device 202 as referenced in FIG. 2A and FIG. 2B. For example, the locking device 302 may include a shelf 304 and a stay 310.

In some examples, the shelf 304 may include a first surface 306 and a second surface 308. The stay 310 may be disposed on the first surface 306 of the shelf 304. In some examples, the stay 310 may include an alignment portion 312. Further, the second surface 308 of the shelf 304 may be disposed on the circuit board 340. For example, the locking device 302 may be positioned on the circuit board 340 such that the locking device 302 may be transitioned between the open position and a closed position within a sliding channel 346 of the circuit board 340, as previously described in connection with FIG. 2A and FIG. 2B.

As illustrated in FIG. 3A, the computing module 364 may include an alignment aperture 370. The shape of the alignment aperture 370 may be a semi-circular shape (as illustrated in FIG. 3A), an oval shape, a squared shape, etc., though examples are not so limiting. The shape of the alignment portion 312 of the stay 310 may correspond to a complimentary shape of the alignment aperture 370 of the computing module 364 to align the locking device 302 to the computing module 364. As such, while the locking device 302 is in the closed position, the alignment portion 312 of the stay 310 may interface with the alignment aperture 370 of the computing module 364.

In further examples, the stay 310 may include the alignment portion 312 and a second portion 314. The second portion 314 of the stay 310 may interface with a first side 366 of the computing module 364. The second portion 314 of the stay 310 may interface with the first side 366 of the computing module 364 such that the second portion 314 of the stay 310 may correspond to a complimentary shape of the first side 366 of the computing module 364 (e.g., semi-circular, oval, squared, etc.) to secure the computing module 364 to the circuit board 340. In this way, while the locking device 302 is in the closed position the alignment portion 312 of the locking device 302 physically interfaces with the alignment aperture 370 of the computing module 364 and the second portion 314 of the stay 310 interfaces with the first side 366 of the computing module 364 to limit a movement of the computing module 364.

In some examples, the alignment aperture 370 of the computing module 364 may comprise a conductive material (e.g., may be plated). Further, the sliding channel 346 of the circuit board 340 may comprise a conductive material (e.g., may be plated). In some examples. the locking device 302 may be comprised of polyoxymethylene (POM), acrylonitrile butadiene styrene (ABS), Nylon, polycarbonate (PC), or a material of similar composition. In these examples, the locking device 302 may isolate the conductive material of the alignment aperture 370 of the computing module 364 from the conductive material of the sliding channel 346 of the circuit board 340.

In other examples, an electrical ground connection between the computing module 364 and the circuit board 340 may be provided. The stay 310, the first surface 306 of the shelf 304, and the second surface 308 of the shelf 304 may include a conductive material (e.g., a metal paint, a sputter, a metal foil or tape, etc., though examples are not so limited) such that while the locking device 302 is in the closed position, the conductive material of the locking device 302 may be in physical contact with the conductive material of the computing module 364 and the circuit board 340. In this example, the locking device 302 may provide an electrical ground connection between the computing module 364 and the circuit board 340. In some examples, the electrical ground connection may be utilized as a noise reduction.

In some examples, the locking device 302 may be comprised of a conductive material such that while the locking device 302 is in the closed position, the locking device 302 may physically contact the conductive material of the alignment aperture 370 of the computing module 364 and the conductive material of the sliding channel 346 of the circuit board 340. In this example, the locking device 302 may provide an electrical ground connection between the computing module 364 and the circuit board 340. The conductive material may be a metal alloy or any other conductive material.

FIG. 3B illustrates an example locking device 302, to interface with a computing module 364 and a circuit board 340, in a closed position. In some examples, the locking device 302 includes the same or similar elements as the locking device 302 as referenced in FIG. 3A. For example, the locking device 302 may include a stay 310 including a second portion 314.

As illustrated in FIG. 3B, while the locking device 302 is in the closed position, the locking device 302 may couple the computing module 364 to the circuit board 340. In some examples, the computing module 364 may comprise an object 378 (e.g., component, connector, antenna, etc.) disposed on a first side 366 of the computing module 364. For example, the object 378 may be disposed adjacent to the alignment aperture at an end of the computing module 364. The second portion 314 of the stay 310 of the locking device 302 may extend over the object 378 disposed on the end of the computing module 364. The second portion 314 of the stay 310 may secure the object 378 to the computing module 364. Additionally, the second portion 314 of the stay 310 may protect the object 378 from damage.

As previously illustrated and described in FIGS. 1-3A, the second portion 314 of the stay 310 was shaped as a semi-circular portion. However, examples of the disclosure are not so limited. As illustrated in FIG. 3B, the locking device 302 may correspond to a particular shape and size of computing device module. For example, the second portion 314 can be rectangularly shaped to correspond with a complimentary shape of the first side 366 of the computing module 364, though examples are not so limited.

Figure 4:
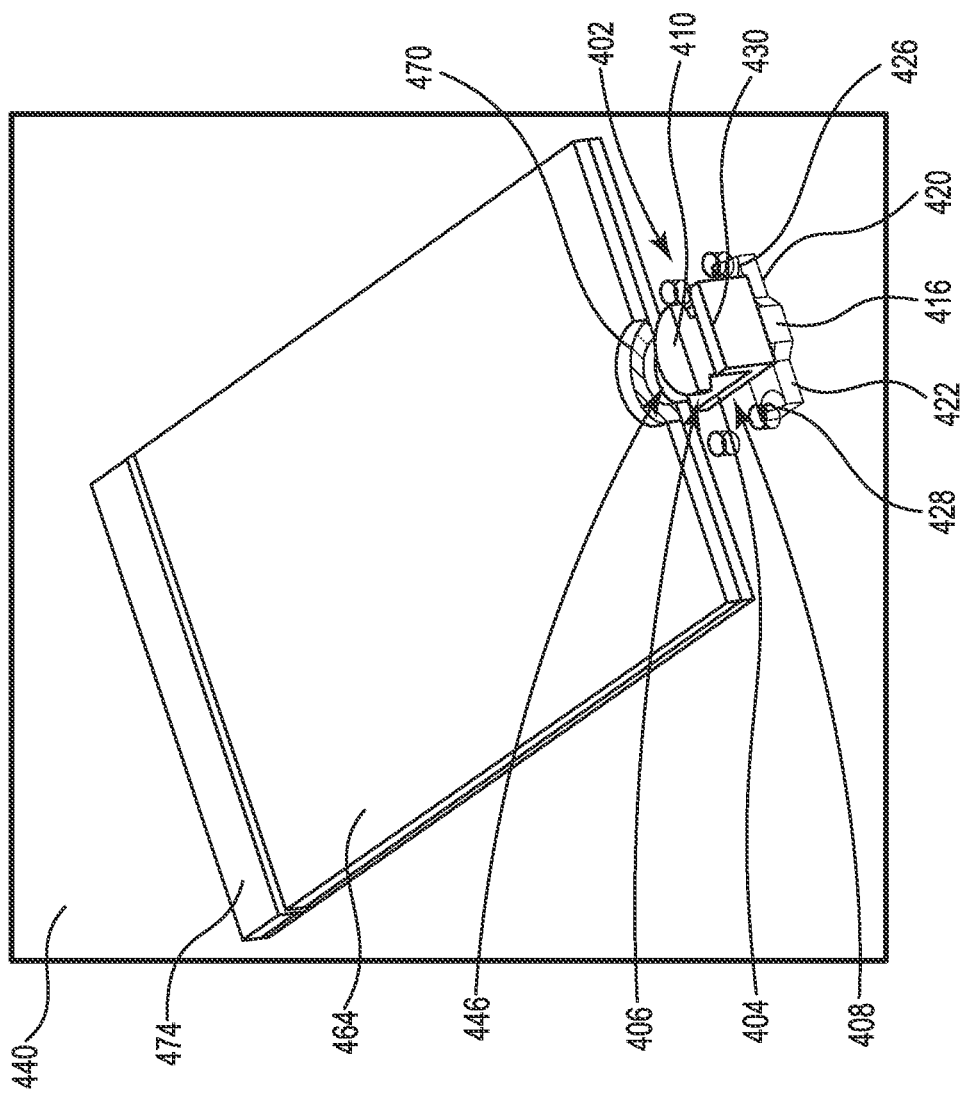
FIG. 4 illustrates an example locking device to secure a computing module to a circuit board.

FIG. 4 illustrates an example locking device 402 to secure a computing module 464 to a circuit board 440, In some examples, the circuit board 440 includes the same or similar elements as the circuit board 140 as referenced in FIG. 1 and the circuit board 240 as reference in FIG. 2A and FIG. 2B. For example, the circuit board 440 may include a sliding channel 446 and the locking device 402. In some examples, the locking device 402 includes the same or similar elements as the locking device 102 as referenced in FIG. 1 and the locking device 202 as reference in FIG. 2A and FIG. 2B. For example, the locking device 402 may include a shelf 404, a stay 410, and an extension member 416.

In some examples, the locking device 402 may further include a lever 430. The lever 430 may be disposed on a first surface 406 of the shelf 404 and located adjacent to the stay 410. As previously described, a force may be applied to the lever 430 to transition the locking device 402, along the sliding channel 446 of the circuit board 440, between an open position (as illustrated in FIG. 4) and a closed position (as previously illustrated in FIG. 2A).

The circuit board 440 may further include an electrical connector 474. The computing module 464 may connect physically and electrically to the electrical connector 474. The computing module 464 may include an alignment aperture 470. While the locking device 402 is in the closed position (as previously illustrated in FIG. 2A) the stay 410 of the locking device 402 may interface with the alignment aperture 470 of the computing module 464. For example, the sliding channel 446 may be disposed on the circuit board 440 a particular distance from the electrical connector 474 such that while the locking device 402 is in the closed position (as previously illustrated in FIG. 2A) and the computing module 464 is electrically and physically seated with the electrical connector 474, the stay 410 may physically interface with the alignment aperture 470 of the computing module 464.

In this way, the computing module 464 may be coupled to the electrical connector 474 such that an electrical connection may be established between the computing module 464 and the circuit board 440. Further, the stay 410 of the locking device 402 may secure the computing module 464 to the circuit board 440 to maintain the electrical connection. The locking device 402 may secure the computing module 464 to the circuit board 440 and the electrical connector 474 to minimize accidental removal or electrical disconnection (e.g., vibrations during transportation or use, accidental strikes, etc.) of the computing module 464 from the electrical connector 474.

For example, the locking device 402 may be located in the sliding channel 446 of the circuit board 440. The shelf 404 of the locking device 402 may include the first surface 406. The first surface 406 may interface with and support the computing module 464. The shelf 404 of the locking device 402 may further include a second surface 408 to interface with the circuit board 440, the second surface 408 being opposite the first surface 406. The stay 410 of the locking device 402 may be disposed on the first surface 406 of the shelf 404 and may be utilized to limit a movement of the computing module 464, as previously described above.

The locking device 402 may further include the extension member 416 connected to the second surface 408 of the shelf 404. A wing may extend from the extension member 416, The wing may include a first wing portion 420 including a first locking tab 426 and a second wing portion 422 including a second locking tab 428, though examples are not so limited (e.g., the wing may include one or multiple wing portions each with zero or more than one locking tab), The extension member 416 may interface with the sliding channel 446 of the circuit board 440 and the first locking tab 426 and the second locking tab 428 may interface with the circuit board 440 on a second side of the circuit board 440 opposite a first side of the circuit board 440, Put another way, the extension member 416 may interface with the sliding channel 446 and the first locking tab 426 and the second locking tab 428 may interface with the circuit board 440 such that the stay 410 of the locking device 402 may secure the computing module 464 to the circuit board 440 and to the electrical connector 474.

Figure 5B:
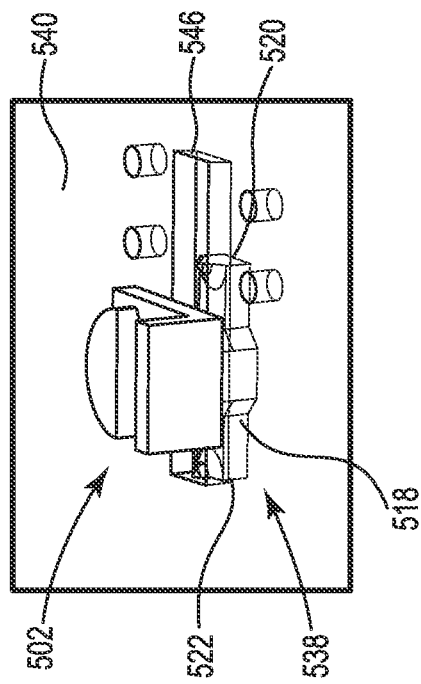
FIG. 5B illustrates an example locking device in a disengaged position with a circuit board.
Figure 5C:
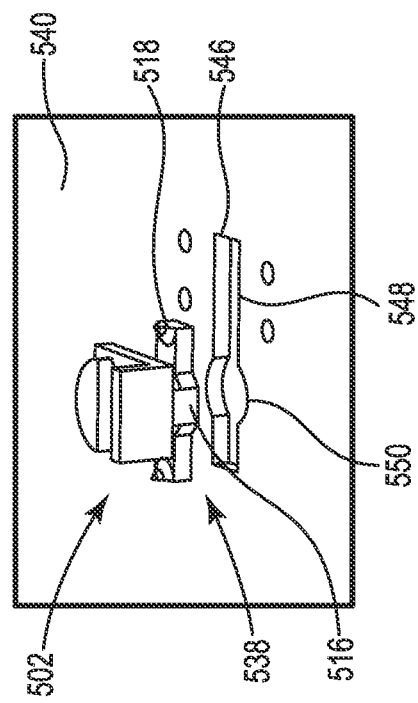
FIG. 5C illustrates an example locking device in a disengaged position.
Figure 5A:
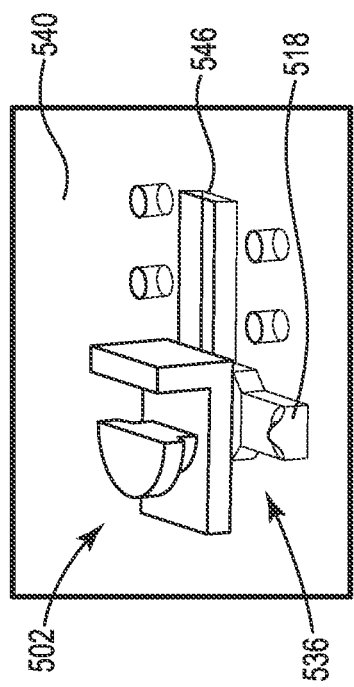
FIG. 5A illustrates an example locking device in an engaged position with a circuit board.

FIG. 5A illustrates an example locking device 502 in an engaged position 536 with a circuit board 540. In some examples, the locking device 502 and the circuit board 540 include the same or similar elements as the locking device 102 and the circuit board 140 as referenced in FIG. 1 and the locking device 202 and the circuit board 240 as referenced in FIG. 2A and FIG. 2B. For example, the locking device 502 may include a wing 518 interfaced with the circuit board 540 and the circuit board 540 may include a sliding channel 546.

As described herein in reference to FIG. 5A, FIG. 5B, and FIG. 5C, the locking device 502 may be removable from the circuit board 540. For example, while the wing 518 of the locking device 502 interfaces with the circuit board 540, as illustrated in FIG. 5A, the locking device 502 may be in the engaged position 536 with the circuit board 540. While the locking device 502 is in the engaged position 536 the locking device 502 may interact with the circuit board 540 to secure a computing module (not illustrated in FIG. 5A) to the circuit board 540.

For example, while the locking device 502 is in the engaged position 536 the wing 518 may be positioned, in relation to the sliding channel 546, at an angle greater than or less than 90 degrees (not illustrated in the FIGS.). For example, the angle of a first wing portion (520 as illustrated in FIG. 5B) of the wing 518 in relation to the sliding channel 546 while the locking device 502 is in the engaged position 536 may be greater than, equal to, or less than 90 degrees. The angle of a second wing portion (522 as illustrated in FIG. 5B) of the wing 518 in relation to the sliding channel 546 while the locking device 502 is in the engaged position 536 may be greater than, equal to, or less than 90 degrees, Additionally, the angle of the first wing portion and the angle of the second wing portion (520 and 522 as illustrated in FIG. 5B) may be equal or may not be equal. For example, the first wing portion and the second wing portion (520 and 522 as illustrated in FIG. 5B) may be disposed on the locking device 502 so as to have different angles in relation to the sliding channel 546. The first wing portion and the second wing portion (520 and 522 as illustrated in FIG. 5B) may include locking tabs that corresponds to locking apertures of the circuit board 540. In this way, the locking device 502 may include an orientation for installation into the circuit board 540.

FIG. 5B illustrates an example locking device 502 in a disengaged position 538 with a circuit board 540. In some examples, the locking device 502 and the circuit board 540 include the same or similar elements as the locking device 102 and the circuit board 140 as referenced in FIG. 1, the locking device 202 and the circuit board 240 as referenced in FIG. 2A and FIG. 2B, and the locking device 502 and the circuit board 540 as referenced in FIG. 5A. For example, the locking device 502 may include a wing 518 to interface with the circuit board 540 and the circuit board 540 may include a sliding channel 546.

As described herein, the locking device 502 may be removable from the circuit board 540. For example, the locking device 502 may be rotatable. The locking device 502 may be rotated from an engaged position (536 as illustrated in FIG. 5A) to the disengaged position (538 as illustrated in FIG. 5B). The locking device 502 may be rotated such that the wing 518 of the locking device 502 may be aligned with the sliding channel 546 of the circuit board 540. In some examples, the wing 518 may include a first wing portion 520 and a second wing portion 522. In this example, the locking device 502 may be rotated such that the first wing portion 520 and the second wing portion 522 are aligned with the sliding channel 546 of the circuit board 540. As such, in response to the locking device 502 being rotated from the engaged position (536 as illustrated in FIG. 5A) to the disengaged position 538 such that the first wing portion 520 and the second wing portion 522 of the wing 518 are aligned with the sliding channel 546, the locking device 502 may be removable from the circuit board 540.

As previously illustrated in FIG. 5A, while the locking device 502 is in the engaged position 536 the wing 518 may be positioned substantially perpendicular (at a 90 degree angle) to the sliding channel 546. As illustrated in FIG. 5B, the locking device 502 may be rotated 90 degrees to the disengaged position 538. While in the disengaged position 538, the wing 518 may be substantially parallel to the sliding channel 546. However, examples are not so limited and the amount of rotation of the locking device 502 may depend upon the orientation of the wing 518 on the locking device 502. As used herein, the term "substantially" intends that the characteristic does not have to be absolute but is close enough so as to achieve the characteristic. For example, "substantially perpendicular" is not limited to absolute perpendicular and "substantially parallel" is not limited to absolute parallel.

FIG. 5C illustrates an example locking device 502 in a disengaged position 538. In some examples, the locking device 502 and the circuit board 540 include the same or similar elements as the locking device 102 and the circuit board 140 as referenced in FIG. 1 and the locking device 202 and the circuit board 240 as referenced in FIG. 2A and FIG. 2B. For example, the locking device 502 may include an extension member 516 and a wing 518 to interface with the circuit board 540 and the circuit board 540 may include a sliding channel 546.

As described herein, the locking device 502 may be removable from the circuit board 540. For example, the locking device 502 may be rotatable. As illustrated in FIG. 5C, the locking device 502 may be rotated from an engaged position (536 as illustrated in FIG. 5A) to the disengaged position (538 as illustrated in FIG. 5B) and removed from the circuit board 540.

The locking device 502 may also be installed onto the circuit board 540 by placing the extension member 516 into the sliding channel 546. For example, the circuit board 540 may receive the locking device 502 via the sliding channel 546 while the wing 518 is aligned with the sliding channel 546 where the locking device 502 is in the disengaged position 538. The sliding channel 546 may include a first section 548 and a second section 550. The first section 548 may have a first width and the second section 550 may have a second width that is wider than the first width. To locate the locking device 502 in the sliding channel 546 the second section 550 may receive the extension member 516 while the locking device 502 is in the disengaged position 538. The received locking device 502 may be rotated from the disengaged position 538 to the engaged position (536 as illustrated in FIG. 5A) to secure the locking device 502 to the circuit board 540. In this way, the locking device 502 may be rotated from the disengaged position 538 to the engaged position (536 as illustrated in FIG. 5A) to allow the locking device 502 to translate within the sliding channel 546.

Figure 6:
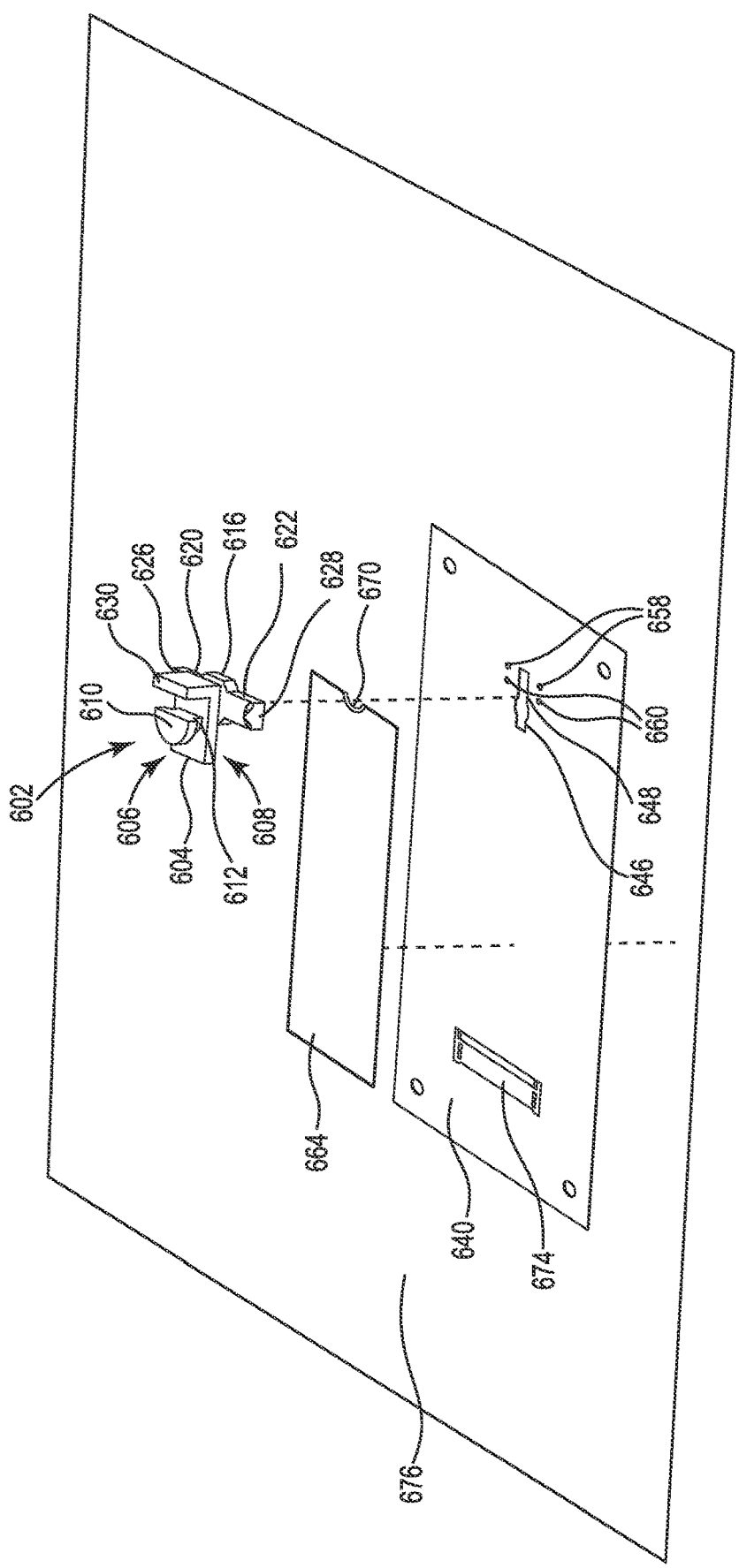
FIG. 6 illustrates an exploded perspective view of an example of a computing device including a computing module coupled to a circuit board with an electrical connector and a locking device.

FIG. 6 illustrates an exploded perspective view of an example of a computing device 676 including a computing module 664 coupled to a circuit board 640 with an electrical connector 674 and a locking device 602. In some examples, the circuit board 640 includes the same or similar elements as the circuit board 140 as referenced in FIG. 1, the circuit board 240 as reference in FIG. 2A and FIG. 2B, and the circuit board 440 as referenced in FIG. 4. For example, the circuit board 640 may include a sliding channel 646 and the locking device 602. In some examples, the locking device 602 includes the same or similar elements as the locking device 102 as referenced in FIG. 1, the locking device 202 as reference in FIG. 2A and FIG. 2B, and the locking device 402 as referenced in FIG. 4. For example, the locking device 602 may include a shelf 604, a stay 610, and an extension member 616.

In some examples, the computing device 676 may include the circuit board 640. The circuit board 640 may include the electrical connector 674 coupled to the circuit board 640 and the locking device 602 located in the sliding channel 646 of the circuit board 640. In some examples, the computing device 676 may include the computing module 664. The computing module 664 may include an alignment aperture 670, The computing module 664 may connect to the electrical connector 674 such that an electrical connection is establish between the computing module 664 and the circuit board 640. The locking device 602 may secure the computing module 664 to the circuit board 640 and the electrical connector 674.

For example, the circuit board 640 may include a first set of locking apertures 658 and a second set of locking apertures 660. The first set of locking apertures 658 and the second set of locking apertures 660 may be arranged adjacent to the sliding channel 646. In some examples, the first set of locking apertures 658 and the second set of locking apertures 660 may be arranged adjacent to a first section 648 of the sliding channel 646.

The shelf 604 of the locking device 602 may include a first surface 606 to interface with and support the computing module 664 and a second surface 608 to interface with the circuit board 640. The stay 610 of the locking device 602 may be disposed on the first surface 606 of the shelf 604. The stay 610 may include an alignment portion 612 to interface with the alignment aperture 670 of the computing module 664. The stay 610 may limit a movement of the computing module 664 by securing the computing module 664 to the circuit board 640 and the electrical connector 674.

The extension member 616 of the locking device 602 may connect to the second surface 608 of the shelf 604. The extension member 616 may include a wing extending from the extension member 616. In some examples, the wing may include a first wing portion 620 including a first locking tab 626 and a second wing portion 622 including a second locking tab 628. The extension member 616 may interface with the sliding channel 646 of the circuit board 640. For example, the locking device 602 may include a lever 630. The lever 630 may be disposed on the first surface 606 of the shelf 604. The lever 630 may be disposed adjacent to the alignment portion 612 of the stay 610. The extension member 616 of the locking device 602 may transition within the sliding channel 646, transitioning the locking device 602 between an open position and a closed position, in response to a force applied to the stay 610 and/or the lever 630, as previously described herein.

In some examples, the first locking tab 626 and the second locking tab 628 may interface with the first set of locking apertures 658 such that the locking device 602 is in the open position. While the locking device 602 is in the open position, the computing module 664 may be installed, removed, or replaced. For example, the computing module 664 may be connected to the electrical connector 674 or removed from the electrical connector 674 while the locking device 602 is in the open position.

In some examples, the first locking tab 626 and the second locking tab 628 may interface with the second set of locking apertures 660 such that the locking device 602 is in the closed position. While the locking device 602 is in the closed position and the first locking tab 626 and the second locking tab 628 may interface with the second set of locking apertures 660 such that the stay 610 is to secure the computing module 664 to the circuit board 640. In some examples, while the locking device 602 is in the closed position, the alignment portion 612 of the stay 610 may physically contact the alignment aperture 670 to secure the computing module 664 to and align the computing module 664 with the locking device 602, the circuit board 640, and the electrical connector 674. In this way, the locking device 602 may limit the movement of the computing module 664.

Figure 7:
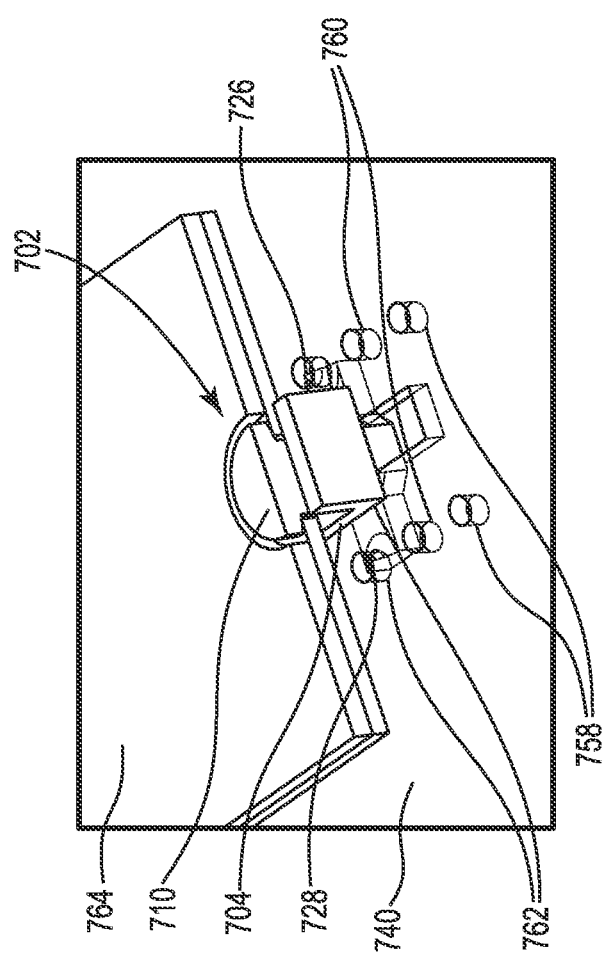
FIG. 7 illustrates an example locking device for physically coupling to and securing a computing module to a circuit board.

FIG. 7 illustrates an example locking device 702 for physically coupling to and securing a computing module 764 to a circuit board 740. In some examples, the circuit board 740 includes the same or similar elements as the circuit board 640 as referenced in FIG. 6. For example, the circuit board 740 may include a first set of locking apertures 758, a second set of locking apertures 760, and the locking device 702. In some examples, the locking device 702 includes the same or similar elements as the locking device 402 as reference in FIG. 4 and the locking device 602 as referenced in FIG. 6. For example, the locking device 702 may include a shelf 704, a stay 710, a first locking tab 726, and a second locking tab 728.

In some examples, the first locking tab 726 and the second locking tab 728 may interface with the first set of locking apertures 758. While the first locking tab 726 and the second locking tab 728 are interfaced with the first set of locking apertures 758, the locking device 702 may be in an open position. While the first locking tab 726 and the second locking tab 728 are interfaced with the second set of locking apertures 760, the locking device 702 may secure a computing device module of a first size to the circuit board 740. In this example, the computing device module of the first size may be located between the shelf 704 and the stay 710 of the locking device 702 while the first locking tab 726 and the second locking tab 728 are interfaced with the circuit board 740 to secure the computing device module of the first size to the circuit board 740.

In some examples, the circuit board 740 may further include a third set of locking apertures 762, While the first locking tab 726 and the second locking tab 728 are interfaced with the third set of locking apertures 762, the locking device 702 may secure a computing device module of a second size to the circuit board 740. The third set of locking apertures 762 may be disposed on the circuit board 740 so as to be a closer distance to an electrical connector (not illustrated in FIG. 7) than the second set of locking apertures 760. Thus, the computing device module of the second size may be smaller than the computing module of the first size. In this example, the computing device module of the second size may be located between the shelf 704 and the stay 710 of the locking device 702 while the first locking tab 726 and the second locking tab 728 are interfaced with the circuit board 740 to secure the computing device module of the second size to the circuit board 740.

In some examples, the circuit board 740 may include multiple sliding channels (not illustrated in the FIGS.) located at varying distances from the electrical connector. For example, the circuit board 740 may include a second sliding channel located at a distance to the electrical connector that is different than the sliding channel depicted in the FIGS. The second sliding channel may include a fourth set of locking apertures and a fifth set of locking apertures. The locking device 702 may be removed, as previously described above, from the sliding channel of the circuit board 740 and received at the second sliding channel. While the locking device 702 is interfaced with the fourth set of locking apertures, the locking device 702 may be in an open position and a computing device module of a third size may be installed. While the locking device 702 is interfaced with the fifth set of locking apertures, the locking device 702 may be in a closed position and may secure and support the computing device module of the third size. Additional sliding channels and sets of locking apertures may be disposed on the circuit board 740

In some examples, the locking device 702 may be removed from the circuit board 740 and replaced with a locking device of a differing size (e.g., wider or longer stay, etc.) to accommodate varying sizes of computing device modules. As described herein, the locking device 702 may support and secure varying sizes of computing device modules to the circuit board 740.

In the foregoing detailed description of the disclosure, reference is made to the accompanying drawings that form a part hereof, and in which is shown by way of illustration how examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the disclosure. Further; as used herein, "a" refers to one such thing or more than one such thing.

The figures herein follow a numbering convention in which the first digit corresponds to the drawing figure number and the remaining digits identify an element or component in the drawing. For example, reference numeral 104 may refer to element 104 in FIG. 1 and an analogous element may be identified by reference numeral 304 in FIG. 3A. Elements shown in the various figures herein can be added, exchanged, and/or eliminated to provide additional examples of the disclosure. In addition, the proportion and the relative scale of the elements provided in the figures are intended to illustrate the examples of the disclosure and should not be taken in a limiting sense.

It can be understood that when an element is referred to as being "on," "connected to", "coupled to", or "coupled with" another element, it can be directly on, connected, or coupled with the other element or intervening elements may be present. In contrast, when an object is "directly coupled to" or "directly coupled with" another element it is understood that are no intervening elements (adhesives, screws, other elements) etc.

The above specification, examples, and data provide a description of the devices of the disclosure. Since many examples can be made without departing from the spirit and scope of the devices of the disclosure, this specification merely sets forth some of the many possible example configurations and implementations.

What is claimed is:

1. A device comprising:
   a circuit board including a sliding channel and a locking aperture; and
   a locking device, comprising:
      a shelf;
      a stay disposed on a first surface of the shelf;
      an extension member connected to a second surface of the shelf, the second surface being opposite the first surface; and
      a wing extending from the extension member, the wing including a locking tab;
   wherein the extension member is to interface with the sliding channel of the circuit board and the locking tab is to interface with the locking aperture of the circuit board such that the stay is to secure a computing module to the circuit board.

2. The device of claim 1, wherein the second surface of the shelf interfaces with a first side of the circuit board and the wing and locking tab of the locking device interface with a second side of the circuit board opposite the first side to secure the locking device to the circuit board.

3. The device of claim 1, wherein the locking aperture of the circuit board is a first locking aperture, the circuit board further including a second locking aperture, wherein:
   while the locking tab of the wing is coupled to the first locking aperture, the locking device is in a closed position such that the locking device secures the computing module to the circuit board; and
   while the locking tab of the wing is coupled to the second locking aperture, the locking device is in an open position such that the computing module is removable from the circuit board.

4. The device of claim 3, wherein while the locking device is in the closed position:
   the first surface of the shelf is to interface with a second side of the computing module to support the computing module;
   an alignment portion of the stay is to interface with an alignment aperture of the computing module, wherein a shape of the alignment portion corresponds to a complimentary shape of the alignment aperture to align the locking device to the computing module; and
   a second portion of the stay is to interface with a first side of the computing module to secure the computing module to the circuit board.

5. The device of claim 4, wherein the alignment aperture of the computing module and the sliding channel of the circuit board include a conductive material.

6. The device of claim 5, wherein the stay, the first surface of the shelf, and the second surface of the shelf include a conductive material such that while the locking device is in the closed position, the conductive material of the locking device is in physical contact with the conductive material of the computing module and the circuit board to provide an electrical ground connection between the computing module and the circuit board.

7. The device of claim 5, wherein the locking device is further comprised of a conductive material such that while the locking device is in the closed position, the locking device is in physical contact with the conductive material of the alignment aperture and the conductive material of the sliding channel to provide an electrical ground connection between the computing module and the circuit board.

8. The device of claim 3, wherein the locking device is to transition from the open position to the closed position within the sliding channel in response to a force applied to the stay.

9. The device of claim 3, wherein the locking device further includes a lever disposed on the first surface of the shelf and adjacent to the stay, wherein the locking device is to transition from the open position to the closed position within the sliding channel in response to a force applied to the lever.

10. The device of claim 1, wherein in response to the locking device being rotated from an engaged position to a disengaged position such that the wing is aligned with the sliding channel, the locking device is removable from the circuit board.

11. The device of claim 1, wherein the circuit board is to receive the locking device via the sliding channel when the wing is aligned with the sliding channel where the locking device is in a disengaged position.

12. The device of claim 11, wherein the locking device is rotatable from the disengaged position to an engaged position to secure the locking device to the circuit board.

13. The device of claim 1, wherein the stay extends over an object disposed on an end of the computing module to secure the object to the computing module.

14. A circuit board, comprising:
an electrical connector coupled to the circuit board;
a computing module coupled to the electrical connector and comprising an alignment aperture;
a sliding channel; and
a locking device located in the sliding channel of the circuit board, wherein the locking device comprises:
 a shelf including a first surface to interface with and support the computing module and a second surface to interface with the circuit board, the second surface being opposite the first surface;
 a stay disposed on the first surface of the shelf, the stay to limit a movement of the computing module;
 a lever disposed on the first surface of the shelf and adjacent to the stay;
 an extension member connected to the second surface of the shelf; and
 a wing extending from the extension member, the wing comprising a first wing portion including a first locking tab and a second wing portion including a second locking tab;
 wherein the extension member is to interface with the sliding channel of the circuit board and the first locking tab and the second locking tab are to interface with the circuit board such that the stay is to secure the computing module to the circuit board.

15. The circuit board of claim 14, wherein the computing module is to be located between the shelf and the stay when the first locking tab and the second locking tab are interfaced with the circuit board to secure the computing module to the circuit board.

16. The circuit board of claim 15, wherein:
the computing module is connected to the electrical connector such that an electrical connection is established between the computing module and the circuit board; and
the stay of the locking device is to secure the computing module to the circuit board to maintain the electrical connection.

17. A computing device comprising:
a computing module including an alignment aperture;
a circuit board comprising:
 an electrical connector coupled to the circuit board and to the computing module;
 a sliding channel; and
 a first set of locking apertures and a second set of locking apertures arranged adjacent to the sliding channel; and
 a locking device located in the sliding channel of the circuit board; wherein the locking device comprises:
  a shelf including a first surface to interface with and support the computing module and a second surface to interface with the circuit board;
  a stay disposed on the first surface of the shelf, the stay including an alignment portion to interface with the alignment aperture of the computing module to limit a movement of the computing module;
  a lever disposed on the first surface of the shelf and adjacent to the stay;
  an extension member connected to the second surface of the shelf; and
  a wing extending from the extension member, the wing comprising a first wing portion including a first locking tab and a second wing portion including a second locking tab;
 wherein the extension member is to interface with the sliding channel of the circuit board and the first locking tab and the second locking tab are to interface with the second set of locking apertures such that the stay is to secure the computing module to the circuit board.

18. The computing device of claim 17, wherein:
the sliding channel includes a first section having a first width and a second section having a second width that is wider than the first width;
to locate the locking device in the sliding channel, the second section is to receive the extension member when the locking device is in a disengaged position; and
the locking device is rotatable from the disengaged position to an engaged position to allow the locking device to translate within the sliding channel.

19. The computing device of claim 18, wherein the first set of locking apertures and the second set of locking apertures are arranged adjacent to the first section of the sliding channel.

20. The computing device of claim 17, wherein the circuit board further comprises a third set of locking apertures such that:
when the first locking tab and the second locking tab are coupled to the first set of locking apertures of the circuit board, the locking device is in an open position;
when the first locking tab and the second locking tab are coupled to the second set of locking apertures, the locking device is to secure a computing device module of a first size to the circuit board; and
when the first locking tab and the second locking tab are coupled to the third set of locking apertures, the locking device is to secure a computing device module of a second size that is smaller than the first size to the circuit board.

* * * * *